(12) United States Patent
Bruder et al.

(10) Patent No.: US 11,249,526 B2
(45) Date of Patent: Feb. 15, 2022

(54) DEVICE FOR DELIVERING A SIGNAL SWITCHING FROM A FIRST STATE TO A SECOND STATE

(71) Applicant: Idemia Identity & Security France, Courbevoie (FR)

(72) Inventors: Bertrand Bruder, Courbevoie (FR); Alexandre Croguennec, Courbevoie (FR)

(73) Assignee: IDEMIA IDENTITY & SECURITY FRANCE, Courbevoie (FR)

( * ) Notice: Subject to any disclaimer, the term of this patent is extended or adjusted under 35 U.S.C. 154(b) by 0 days.

(21) Appl. No.: 17/096,448

(22) Filed: Nov. 12, 2020

(65) Prior Publication Data

US 2021/0141431 A1 May 13, 2021

(30) Foreign Application Priority Data

Nov. 13, 2019 (FR) ..................................... 1912669

(51) Int. Cl.
*G06F 1/24* (2006.01)
*G06F 1/28* (2006.01)
*H03K 5/24* (2006.01)
*H03K 17/22* (2006.01)
*H03K 23/54* (2006.01)

(52) U.S. Cl.
CPC .................. *G06F 1/24* (2013.01); *G06F 1/28* (2013.01); *H03K 5/24* (2013.01); *H03K 17/22* (2013.01); *H03K 23/54* (2013.01)

(58) Field of Classification Search
CPC combination set(s) only.
See application file for complete search history.

(56) References Cited

U.S. PATENT DOCUMENTS

| 6,198,319 | B1 * | 3/2001 | Hara | .................... H03K 17/223 327/143 |
|---|---|---|---|---|
| 10,013,042 | B1 | 7/2018 | Abhishek et al. | |
| 2007/0252626 | A1 | 11/2007 | Chou | |
| 2014/0111259 | A1 | 4/2014 | Lin | |
| 2017/0160792 | A1 * | 6/2017 | Tokioka | ................ G06F 1/3234 |

* cited by examiner

*Primary Examiner* — Long Nguyen
(74) *Attorney, Agent, or Firm* — Womble Bond Dickinson (US) LLP

(57) ABSTRACT

A device (1) for delivering a signal switching from a first state to a second state, comprising: a primary circuit (4) generating a primary signal; and a secondary circuit (6) configured to: when the primary signal is initialized to the second state upon power-up, initialize a ring counter (16) to a random value in a finite sequence including a reference value, change the value of the first ring counter (16) by running through the first finite sequence in a circular fashion, and deliver at an output (3): i) a secondary signal in the first state, when the value of the first counter is different from the reference value, and ii) the primary signal, when the value of the first counter is equal to the reference value.

18 Claims, 2 Drawing Sheets

[Fig. 1]
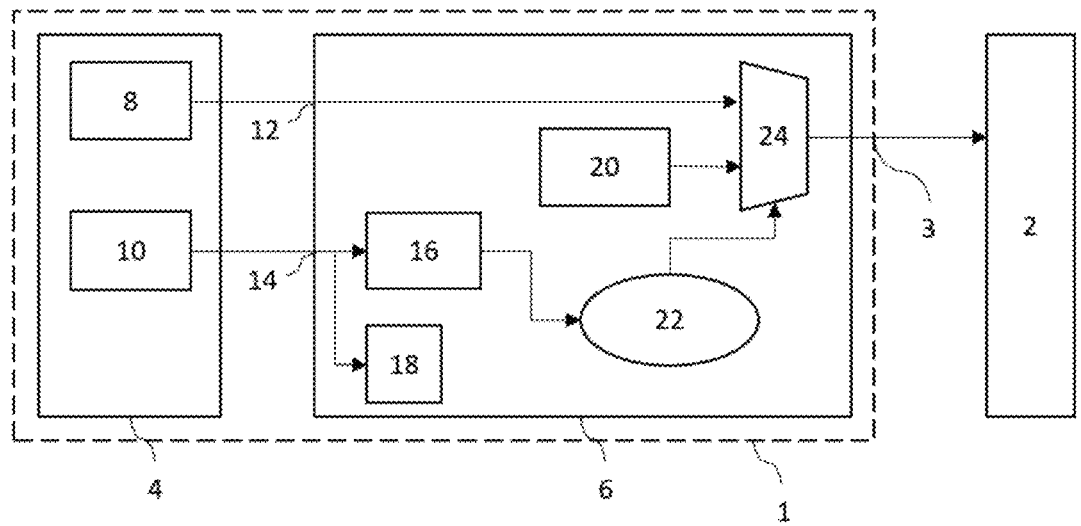
[Fig. 2]
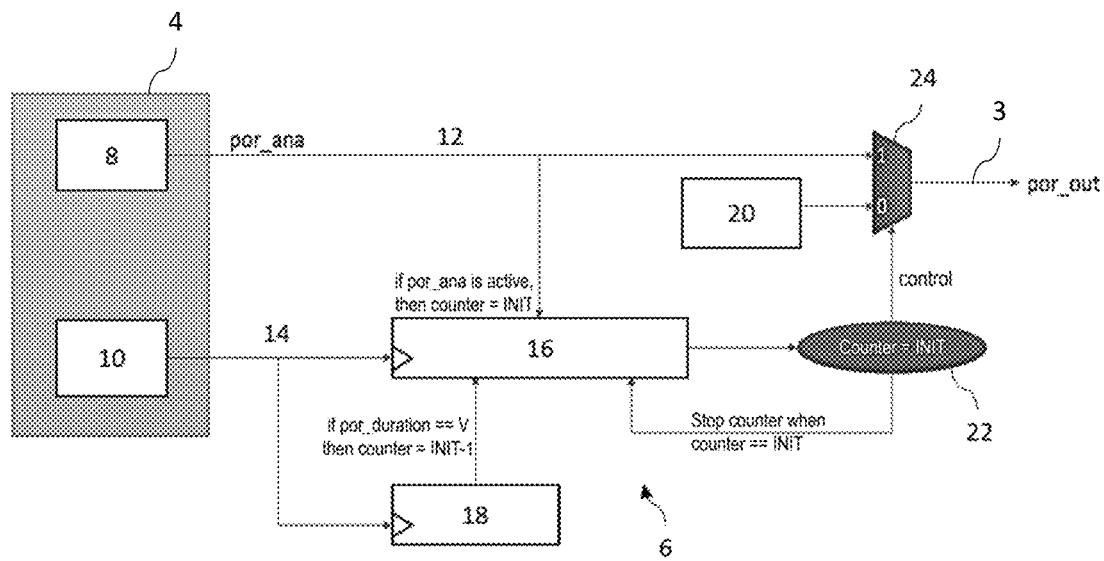

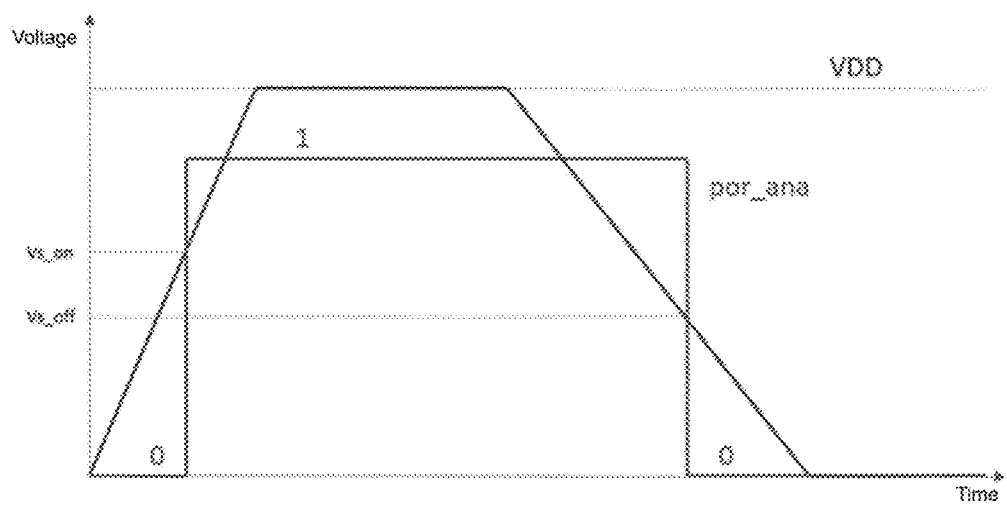
[Fig. 3]

DEVICE FOR DELIVERING A SIGNAL SWITCHING FROM A FIRST STATE TO A SECOND STATE

TECHNICAL FIELD OF THE INVENTION

This invention relates to a device for delivering a signal switching from a first state to a second state and a method capable of being implemented by such a device. Such a signal is advantageously used to initialize a target circuit.

STATE OF THE ART

Some circuits trigger processing upon receiving a signal switching from a first state to a second state, following power-up. This processing must be triggered quickly after such power-up.

Thus, upon power-up, a device generates the signal by initializing the signal in the first state, before switching this signal to the second state, and sends this signal to a target circuit. Upon receipt of this signal, the target circuit triggers processing.

However, the device delivering the signal expected by the circuit may malfunction, with the consequence that the signal it delivers does not contain the expected transition from the first state to the second state. For example, the signal may be initialized not in the first state, but in the second state, which delays or even prevents the triggering of the processing, which is supposed to be implemented by the target circuit.

OVERVIEW OF THE INVENTION

One aim of the invention is to propose a device for delivering a signal switching from a first state to a second state in a more reliable manner.

To this end, a device is proposed, according to a first aspect, for delivering a signal switching from a first state to a second state, the device comprising a primary circuit configured to generate a primary signal, the primary signal being initialized to the first state or to the second state upon power-up of the device, the device further comprising a secondary circuit configured to:
  when the primary signal is initialized to the second state upon power-up, initialize a first ring counter to a random value comprised in a first finite sequence, the first finite sequence comprising a first reference value,
  change the value of the first ring counter by running through the first finite sequence in a circular fashion,
  deliver at an output: i) a secondary signal in the first state, when the value of the first counter is different from the first reference value, and ii) the primary signal generated by the primary circuit, when the value of the first counter is equal to the first reference value.

The device according to the first aspect may further comprise the following optional features, taken alone or combined with each other, whenever this is technically possible.

Preferably, the secondary circuit is configured to hold the first ring counter at the first reference value, once the first reference value is reached by the first ring counter.

Preferably, the secondary circuit is configured to initialize the first ring counter to the first reference value, when the primary signal is initialized to the first state upon power-up.

Preferably, the value of the first ring counter is encoded on a number of bits greater than or equal to 16, for example 32.

Preferably, the secondary circuit comprises a clock input for receiving a clock signal defining clock strokes, and is configured to change the value of the first ring counter at each clock stroke defined by the received clock signal.

Preferably, the primary circuit is configured to generate the clock signal.

Preferably, the first ring counter is a cascade counter and/or of one of the following types: incremental, decremental, Möbius, LFSR.

Preferably, the secondary circuit is further configured to:
  upon power-up, initialize a second ring counter to a random value comprised in a second finite sequence having a shorter length than that of the first finite sequence,
  change the value of the second ring counter by running through the second finite sequence in a circular fashion,
  approximate the value of the first ring counter to the first reference value, when the second counter reaches a second reference value comprised in the 20 second finite sequence.

Preferably, the approximation is carried out by adjusting the first ring counter to a value which immediately precedes the first reference value in the first finite sequence that is run through in a circular fashion.

Preferably, the value of the second ring counter is encoded on a number of bits strictly greater than 1, for example 4 bits.

Preferably, the secondary circuit is configured to change the value of the second ring counter at each clock stroke defined by the received clock signal.

Preferably, the second ring counter is a cascade counter and/or of one of the following types: incremental, decremental, Möbius, LFSR.

Preferably, the first state is a zero state and the second state is a one state.

Preferably, the secondary circuit is configured to generate the secondary signal.

Preferably, the primary circuit is configured to switch the primary signal to the first state when the device is powered down.

According to a second aspect, a system comprising a device according to the first aspect, and a target circuit configured to implement predetermined processing upon receipt of the signal delivered by the device according to the first aspect, such as initialization, are also proposed.

According to a third aspect, a method for delivering a signal switching from a first state to a second state is also proposed, the method comprising the following steps:
  generating, by a primary circuit, a primary signal, the primary signal being initialized to the first state or the second state upon power-up of the primary circuit,
  when the primary signal is initialized to the second state at power-up, initializing a first ring counter to a random value comprised in a first finite sequence comprising a first reference value, the first ring counter changing its value as it runs through the first finite sequence in a circular fashion,
  delivering at an output: i) a secondary signal in the first state, when the value of the first counter is different from the first reference value, and ii) the primary signal generated by the primary circuit, when the value of the first counter is equal to the first reference value.

DESCRIPTION OF THE FIGURES

Other characteristics, purposes and advantages of the invention will become clear from the following description, which is purely illustrative and non-limiting, and which must be read in the context of the attached drawings in which:

FIG. 1 schematically shows a system according to one embodiment.

FIG. 2 is an illustrative block diagram of a method implemented by the system in FIG. 1.

FIG. 3 shows the evolution over time of a supply voltage signal, and that of a primary signal switching from a first state to a second state.

In the set of figures, similar elements are marked with identical references.

DETAILED DESCRIPTION OF THE INVENTION

Referring to FIG. 1, a system, for example a System-on-Chip (SoC), comprises a device 1 for delivering a signal switching from a first state to a second state, following power-up of the system, and a target circuit 2 suitable for receiving this signal.

The target circuit 2 is configured to implement a predetermined processing upon receipt of this signal.

The target circuit 2 is a digital circuit.

For example, the first state is a zero state and the second state is a one state. In this case, when the target circuit 2 receives from the device 1 a signal that switches from zero to one, it implements the predetermined processing.

For example, the predetermined processing is an initialization of the target circuit 2. In other words, the target circuit 2 is configured to initialize, upon receipt of the signal delivered by the device 1, the signal, then being an initialization signal.

The device 1 comprises an output 3 for delivering to the target circuit 2 the signal switching from the first state to the second state.

The initialization device 1 comprises a primary circuit 4 and a secondary circuit 6.

The primary circuit 4 comprises a primary generator 8 for generating a primary signal when the system powers on. The primary signal is capable of alternating between the first state and the second state.

More specifically, the primary generator 8 is configured to generate the primary signal based on a supply voltage applied to it by an electric voltage source.

Preferably, the primary circuit 4 comprises an analog input stage measuring the supply voltage, and the primary generator 8 is a digital generator. The primary signal is therefore, in this case, digital. In fact, the primary circuit 4 acts as an analog-to-digital converter since, in this case, an analog input signal (the supply voltage) is converted into a digital signal (the primary signal).

In addition, the primary circuit 4 comprises a clock 10 configured to generate a clock signal. The clock signal defines successive clock strokes, typically by means of a periodic pattern.

The clock 10 typically comprises an oscillator.

The secondary circuit 6 comprises a primary input 12 to receive the primary signal generated by the primary generator 8.

The secondary circuit 6 further comprises a clock input 14 to receive the clock signal generated by the clock 10.

The secondary circuit 6 is typically a digital circuit.

The secondary circuit 6 comprises a first ring counter 16. The set of values that can be taken by the first ring counter 16 defines a first finite sequence, i.e., this set is ordered. The first ring counter 16 changes its value as it runs through this first finite sequence.

The first ring counter 16 has a value which is encoded on N bits.

Consequently, this value can take $2^N$ different values.

The first ring counter 16 changes its value with each clock stroke defined by the clock signal received by the clock input 14.

Preferably, N is greater than or equal to 16. This has the advantage of having a relatively large first finite sequence. For example, when N=32, the first finite sequence is 4294967296 in length, i.e., the first ring counter 16 is capable of taking 4294967296 different values.

Due to its annular nature, the first ring counter 16 runs through the first finite sequence in a circular fashion, i.e., when the first ring counter 16 reaches the end of the first finite sequence, the first counter loops back to the beginning of this finite sequence.

For example, when the first ring counter 16 is incremental, the first finite sequence is ascending. Thus, the last value of the first finite sequence is a maximum value (typically the value $2^N-1$), and the first ring counter 16 loops back to a minimum value of that sequence (typically the value zero).

Alternatively, the first ring counter 16 is decremental, in which case the first finite sequence is descending.

In other variants, the first ring counter 16 is Möbius, or LFSR (Linear Feedback Shift Register). In these other variants, the first finite sequence is not necessarily run through monotonically. Using a Möbius counter in particular has the advantage that it requires only a small implementation area, as it requires little logic.

The first ring counter 16 is typically implemented in the secondary circuit 6 by means of a plurality of interconnected scales in an arrangement known to the person skilled in the art.

The first counter is preferably a cascade counter. A cascade counter is a multistage counter, wherein the output of one stage serves as a clock for a subsequent stage. This has the advantage that it consumes less energy than a synchronous counter.

The first finite sequence comprises in particular an INIT value, hereinafter referred to as the first reference value.

The secondary circuit 6 is configured to initialize the first ring counter 16 to a value of the first finite sequence, referred to as initial value, according to a policy that depends on how the primary signal generated by the primary generator 8 is initialized when the system is powered up. This policy will be described in detail below.

The secondary circuit 6 is also configured to hold the first ring counter 16 in the first reference value INIT, once the latter has been reached. In other words, the first ring counter 16 is stopped once it reaches the first reference value INIT.

The secondary circuit 6 also comprises a second ring counter 18. Like the first ring counter 16, the set of values that can be taken by the second ring counter 18 defines a second finite sequence, namely this set is ordered.

The second ring counter 18 has a value which is encoded in M bits. Consequently, this value can take $2^M$ different values.

The second finite sequence run through by the second ring counter 18 in a circular fashion is shorter in length than that of the first finite sequence. In other words, we have M<N.

The second ring counter 18 advantageously changes value at each clock stroke defined by the clock signal received by the clock input 14. This is advantageous since it allows simpler synchronization of the value changes of the two circular counters 16 and 18.

The second ring counter 18 can be one of the types considered above for the first ring counter 16. The second ring counter 18 can be identical or different from the first ring counter 16.

The second finite sequence comprises in particular a V value, referred to hereinafter as the second reference value.

The secondary circuit 6 is configured to initialize the first ring counter 16 to a value randomly selected in the first finite sequence.

The secondary circuit 6 also comprises a secondary generator 20 configured to generate a secondary signal in the first state. The secondary generator 20 is different from the primary generator 8.

The secondary circuit 6 further comprises a comparator 22 configured to compare a value taken by the first ring counter 16 with the first reference value INIT.

The secondary circuit 6 further comprises a switch 24 connected to the primary circuit 4, connected to the secondary generator 20, and further connected to the output 3 of the initialization device 1. The switch 24 is configurable in two configurations: a primary configuration wherein the switch 24 selectively redirects, to the output 3 of the initialization device 1, the primary signal generated by the primary generator 8, and a secondary configuration wherein the switch 24 selectively redirects, to the output 3, the secondary signal generated by the secondary generator 20.

As detailed below, the switch 24 is configured to be set up in one of these two configurations, depending on the result of a comparison implemented by the comparator 22.

Referring to FIG. 2, a method implemented by the system described above comprises the following steps.

The system is powered up at a given time. From this moment on, a VDD supply voltage is applied to the various components of the system, in particular to the primary circuit 4.

The primary generator 8 generates a primary signal "por_ana", which depends on the applied supply voltage.

In normal operation, the VDD supply voltage applied to the primary circuit 4, initially at zero, increases gradually, for example linearly in the example shown in FIG. 3.

As long as the VDD supply voltage applied to the primary generator 8 remains below a threshold Vs_on, the primary signal "por_ana" generated by the primary generator 8 is in the first state (zero state in the case shown in FIG. 3). When the supply voltage applied to the primary generator 8 exceeds the threshold Vs_on, the primary signal "por_ana" generated by the primary generator 8 switches to the second state (one state in the case shown in FIG. 3).

An inverse logic is subsequently implemented when the system is powered down, using another threshold Vs_off. When the VDD supply signal drops below this threshold Vs_off, the primary signal "por_ana" returns to the first state. The threshold Vs_off is preferably lower than the threshold Vs_on.

Back to FIG. 2, the clock 10 generates the clock signal described above defining successive clock strokes.

The secondary circuit 6 receives at its primary input 12 the primary signal "por_ana" generated by the primary generator 8, and also receives the clock signal generated by the clock 10 at its clock input 14.

The secondary circuit 6 initializes at power-up the first ring counter 16 to an initial value comprised in the first finite sequence (in FIG. 2, the current value taken by the first ring counter 16 is called "counter").

The selection policy of the initial value implemented by the secondary circuit 6 depends on the state of the primary signal "por_ana" at power-up.

Regardless of this policy, the comparator 22 compares the initial value of the first ring counter 16 with the first reference value INIT.

If the values compared by the comparator 22 are different, the switch 24 is placed in the secondary configuration (designated in FIG. 2 by the value 0 at the bottom left of the trapezoid representing the switch 24). In this secondary configuration, the switch 24 selectively redirects the secondary signal generated by the secondary generator 20 to the output 3 of the initialization device 1, this secondary signal being in the first state.

If, on the contrary, the values compared by the comparator 22 are equal, the switch 24 is placed in the primary configuration, wherein the switch 24 selectively redirects the primary signal "por_ana" generated by the primary generator 8 to the output 3 of the initialization device 1 (in FIG. 2, the primary configuration is designated by the value 1 at the top left of the trapezoid representing the switch 24).

At the next clock stroke defined by the clock signal, the secondary circuit 6 updates the first ring counter 16 to the value following the initial value in the first finite sequence, running through this sequence in a circular fashion.

The comparator 22 repeats the comparison step following this update, i.e., it compares the updated value of the first ring counter 16 with the first reference value INIT.

If the values compared by the comparator 22 during this new 30 comparison are different, the switch 24 remains in the secondary configuration, and thus continues to selectively redirect the secondary signal in the first state, generated by the secondary generator 20, to the output 3 of the initialization device 1.

If, on the contrary, the values compared by the comparator 22 during this new comparison are equal, the switch 24 switches to its primary configuration wherein it selectively redirects the primary signal "por_ana" generated by the primary generator 8 to the output 3 of the initialization device 1.

Case Wherein the Primary Signal is Initialized to the First State

When the primary circuit 4 is operating normally, the primary signal "por_ana" is initialized to the first state upon power-up of the system and then switches to the second state later.

When the secondary circuit 6 detects that the primary signal "por_ana" has been initialized by the primary circuit 4 to the first state, the secondary circuit 6 initializes the first ring counter 16 to the first reference value INIT, i.e., it deterministically selects this value INIT as the initial value of the first ring counter 16.

Thus, in this case, the switch 24 necessarily starts by redirecting the primary signal "por_ana" to the output 3.

Furthermore, if the first ring counter 16 is configured to be held at the first reference value INIT once this value has been reached, the switch 24 remains in this primary configuration wherein the primary signal "por_ana" is redirected to the output of the initialization device.

Subsequently, when the primary signal "por_ana" switches from the first state to the second state, this transition is also redirected to the output.

Thus, in this case of normal operation, the signal "por_out" switching from the first state to the second state, which is ultimately delivered to the target circuit 2 via the output 3, is formed by the primary signal "por_ana" supplied by the primary circuit 4. Thus it is the primary signal "por_ana" supplied by the primary circuit 4 which alone makes possible the triggering of the predetermined processing by the target circuit 2.

Case Wherein the Primary Signal is Initialized to the Second State

When the primary circuit 4 operates abnormally, the primary signal "por_ana" may, for some unknown reason, be initialized by the primary circuit 4 to the second state. As long as this situation persists, the primary signal "por_ana" is not able to trigger the predetermined processing of the target circuit 2. It will be seen in the following that the secondary circuit 6 plays an active role in overcoming this failure.

When the secondary circuit 6 detects that the primary signal "por_ana" has been initialized by the primary circuit 4 to the second state, the secondary circuit 6 initializes the first ring counter 16 to a randomly selected initial value.

If, in exceptional circumstances, this randomly selected initial value turns out to be the first reference value INIT, the switch 24 behaves as described above, i.e., it selectively redirects the primary signal "por_ana" to the output, and is held in this configuration if the first ring counter 16, for its part, is held in the value INIT as described above. However, the probability of coming across this very specific case is equal to $1/2^N$, this probability therefore decreases exponentially with N. This probability is particularly low when N is greater than or equal to 16.

If, on the contrary, the initial value to which the first ring counter 16 has been randomly initialized at power-up is different from the first reference value INIT (which is likely), the comparator 22 notes this difference, and the switch 24 starts by redirecting to the output the secondary signal generated by the secondary generator 20, this secondary signal being in the first state.

After a certain number of clock strokes, which depends on the initial value, the first ring counter 16 finally reaches the first reference value INIT. The comparator 22 then detects an equality of values and the switch 24 redirects the primary signal "por_ana" in the second state to the output 3, instead of the secondary signal, by switching from the secondary configuration to the primary configuration.

Thus, if the primary signal "por_ana" is initialized to the second state on power-up, this abnormal situation is compensated for by the secondary circuit 6, which plays an active role in creating a transition from the first state to the second state which is seen by the target circuit 2, by means of the switchover carried out by the switch 24 using the first ring counter 16. The secondary circuit 6 thus has the effect of being able to cause the target circuit 2 to obtain a signal "por_out" switching from the first state to the second state, even if the primary signal "por_ana" does not contain this state transition. This "por_out" signal sent at the output 3 is formed here by a combination of the primary signal "por_ana" and the secondary signal.

It should be noted here that, even if the primary circuit 4 is faulty, it still participates in the formation of the transition from the first state to the second state which is perceived by the target circuit 2, since the secondary circuit 6 redirects the primary signal "por_ana" to the second state after switching from the secondary configuration to the secondary configuration. This has several benefits.

Firstly, it enables the target circuit to detect a subsequent return of the primary signal "por_ana" to the first state, when there is a drop in the supply voltage applied to the primary generator 8, this return tending to occur even in the above-mentioned failure case wherein the signal "por_ana" is initialized to the second state. Indeed, this return to the first state is retranscribed in the output signal "por_out" when the switch is in the primary configuration.

Secondly, the probability of not obtaining a transition from the first state to the second state in the "por_out" signal supplied by the device 1 is equal to the product of the probability of failure of the primary circuit multiplied by the probability that the first ring counter 16 initializes at INIT. This probability of not obtaining is reduced compared to an autonomous operation of the secondary circuit alone.

It should be noted that holding the first ring counter 16 at the first reference value INIT once this value has been reached is, although optional, very advantageous. Indeed, this holding makes it possible to prevent the switch 24 from switching back from the primary configuration to the secondary configuration at the next clock stroke. If this happens, the signal "por_out" sent to the target circuit 2 via the output 3 remains in the second state only for a very brief period of time, and is therefore liable to not be correctly detected by the target circuit 2, and so the predetermined processing may not be triggered by the target circuit 2. Use of the second ring counter 18 for reducing the time to obtain a signal switching from the first state to the second state The secondary circuit 6 also initializes the second ring counter 18 to a randomly selected initial value in the second finite sequence upon power-up of the system.

This initialization is implemented when the secondary circuit 6 detects that the primary signal "por_ana" has been initialized by the primary circuit 4 in the second state (case of abnormal operation).

At each new clock stroke defined by the clock signal, the secondary circuit 6 updates the second ring counter 18 to the next value of the second finite sequence in a circular fashion. In FIG. 2, the current value taken by the second ring counter 18 is called "por_duration".

When the second ring counter 18 reaches the second reference value V, the secondary circuit 6 approximates the value of the first ring counter 16 to the first reference value INIT. This allows the first ring counter 16 to reach the value INIT faster, and thus to switch the switch 24 from the secondary configuration to the primary configuration faster, and consequently to create a transition from the first state to the second state to the output 3 of the initialization device 1. The target circuit 2 therefore initializes faster, by receiving the signal "por_out" provided by the device 1 via its output 3.

It should be noted in this respect that the probability that the second ring counter 18 reaches the value V before the first ring counter 16 reaches the value INIT is high, since the length of the first finite sequence is greater than that of the second finite sequence.

Very advantageously, the approximation performed by the second ring counter 18 adjusts the first ring counter 16 to a value which the first ring counter 16 takes just before reaching the first reference value INIT when running through the first finite sequence in a circular fashion, i.e., to a value which immediately precedes INIT in the finite sequence run through circularly.

For example, if the first ring counter 16 is incremental, with a first finite sequence ranging from 0 to $2^N-1$, this immediately preceding value is $2^N-1$ in the particular case where INIT=0 (this results from the annular nature of the counter), and is INIT−1 in all other cases.

Thus, it only takes one clock stroke for the first reference value INIT to be reached by the first ring counter 16.

Preferably, the second ring counter is not used, when the secondary circuit 6 detects that the primary signal "por_ana" has been initialized by the primary circuit 4 in the first state (normal operation case).

Other Embodiment Variants

The system and the method as defined above can be subject to further variants.

The signal "por_out" delivered by the device 1 to the target circuit 2 may have a function other than that which consists in triggering an initialization of the target circuit 2.

Furthermore, the first state does not necessarily have to be a zero state and the second state a one state. For example, these two values can be reversed.

The clock 10 is not necessarily an integral part of the primary circuit 4 (even though such an inclusion in the primary circuit 4 has advantages in terms of securing the system against attacks, which would aim to take control of the system by issuing inappropriate signal forms into the clock input, should the latter come from circuitry external to the device 1).

The invention claimed is:

1. A device comprising a primary circuit configured to generate a primary signal, the primary signal being initialized to a first state or to a second state upon power-up of the device, the device further comprising a secondary circuit configured to:
   when the primary signal is initialized to the second state upon power-up, initialize a first ring counter to a random value comprised in a first finite sequence, the first finite sequence comprising a first reference value,
   change the value of the first ring counter by running through the first finite sequence in a circular fashion,
   deliver at an output: i) a secondary signal in the first state, when the value of the first) ring counter is different from the first reference value, and ii) the primary signal generated by the primary circuit, when the value of the first ring counter is equal to the first reference value.

2. The device according to claim 1, wherein the secondary circuit is configured to hold the first ring counter at the first reference value, once the first reference value is reached by the first ring counter.

3. The device according to claim 1, wherein the secondary circuit is configured to initialize the first ring counter to the first reference value, when the primary signal is initialized to the first state upon power-up.

4. The device according to claim 1, wherein the value of the first ring counter is encoded on a number of bits greater than or equal to 16.

5. The device according to claim 1, wherein the secondary circuit comprises a clock input for receiving a clock signal defining clock strokes, and is configured to change the value of the first ring counter at each clock stroke defined by the clock signal.

6. The device according to claim 5, wherein the primary circuit is configured to generate the clock signal.

7. The device according to claim 1, wherein the first ring counter is one of the following types: a cascade counter, an incremental counter, a decremental counter, Möbius, a LFSR counter.

8. The device according to claim 1, wherein the secondary circuit is further configured to:
   on power-up, initialize a second ring counter to a random value comprised in a second finite sequence having a shorter length than that of the first finite sequence,
   change the value of the second ring counter by running through the second finite sequence in a circular fashion,
   approximate the value of the first ring counter to the first reference value, when the second counter reaches a second reference value comprised in the second finite sequence.

9. The device according to claim 8, wherein the approximation is carried out by adjusting the first ring counter to a value which immediately precedes the first reference value in the first finite sequence that is run through in a circular fashion.

10. The device according to claim 8, wherein the value of the second ring counter is encoded on a number of bits strictly greater than 1.

11. The device according to claim 8, wherein the secondary circuit comprises a clock input for receiving a clock signal defining clock strokes, and is configured to change the value of the second ring counter at each clock stroke defined by the clock signal.

12. The device according to claim 8, wherein the second ring counter is one of the following types: a cascade counter, an incremental counter, a decremental counter, a Möbius counter, a LFSR counter.

13. The device according to claim 1, wherein the first state is a zero state and the second state is a one state.

14. The device according to claim 1, wherein the secondary circuit is configured to generate the secondary signal.

15. The device according to claim 1, wherein the primary circuit is configured to switch the primary signal to the first state when the device is powered down.

16. A system comprising a device according to claim 1, and a target circuit configured to implement a predetermined processing upon receipt of the signal delivered by the device.

17. The system according to claim 16, wherein the predetermined processing is an initialization of the target circuit.

18. A method comprising:
   generating, by a primary circuit, of a primary signal, the primary signal being initialized to a first state or to a second state upon power-up of the primary circuit,
   when the primary signal is initialized to the second state at the power-up of the primary circuit, initializing a first ring counter to a random value comprised in a first finite sequence comprising a first reference value, the first ring counter changing its value as it runs through the first finite sequence in a circular fashion,
   delivering at an output of a secondary circuit i) a secondary signal in the first state, when the value of the first ring counter is different from the first reference value, and ii) the primary signal generated by the primary circuit, when the value of the first ring counter is equal to the first reference value.

* * * * *